United States Patent
Kayukawa et al.

(10) Patent No.: US 7,487,418 B2
(45) Date of Patent: Feb. 3, 2009

(54) SEMICONDUCTOR INTEGRATED CIRCUIT AND METHOD FOR TESTING SAME

(75) Inventors: Yoshitaka Kayukawa, Kanagawa (JP); Tetsuya Aoki, Tokyo (JP); Takahiro Hamaguchi, Kanagawa (JP); Noriyuki Oshima, Kanagawa (JP)

(73) Assignee: Sony Corporation, Tokyo (JP)

( * ) Notice: Subject to any disclaimer, the term of this patent is extended or adjusted under 35 U.S.C. 154(b) by 301 days.

(21) Appl. No.: 10/647,217

(22) Filed: Aug. 26, 2003

(65) Prior Publication Data

US 2004/0153801 A1 Aug. 5, 2004

(30) Foreign Application Priority Data

Sep. 24, 2002 (JP) ............................ P2002-277285

(51) Int. Cl.
*G01R 31/3177* (2006.01)
*G01R 31/40* (2006.01)

(52) U.S. Cl. ........................ 714/727; 714/724

(58) Field of Classification Search ................. 714/726, 714/727, 730, 733, 724, 42, 25; 327/156
See application file for complete search history.

(56) References Cited

U.S. PATENT DOCUMENTS 3,961,254 A * 6/1976 Cavaliere et al. ............ 714/730
5,040,150 A * 8/1991 Naitoh et al. ................ 365/201
5,283,889 A * 2/1994 DeLisle et al. ................ 703/24
6,118,316 A * 9/2000 Tamamura et al. .......... 327/156
6,539,511 B1 * 3/2003 Hashizume .................. 714/727

FOREIGN PATENT DOCUMENTS

| JP | 63-134970 | 6/1988 |
| JP | 04-072583 | 3/1992 |
| JP | 04-287510 | 10/1992 |
| JP | 05-172897 | 7/1993 |
| KR | 2001011641 A * | 2/2001 |

* cited by examiner

*Primary Examiner*—Cynthia Britt
*Assistant Examiner*—Dipakkumar Gandhi
(74) *Attorney, Agent, or Firm*—Rader, Fishman & Grauer PLLC; Ronald P. Kananen

(57) ABSTRACT

An LSI which makes scan testing possible without compromising security is provided. Flip-flops that constitute a scan chain are reset when scan testing is initiated or terminated by the edges of a mode signal for switching between normal operations and scan testing. In addition, during scan testing, internal memory means is made inaccessible. Further, a dummy flip-flop that operates only during scan testing is connected to the scan chain, and shifting out by the scan chain during normal operations is made impossible.

19 Claims, 4 Drawing Sheets

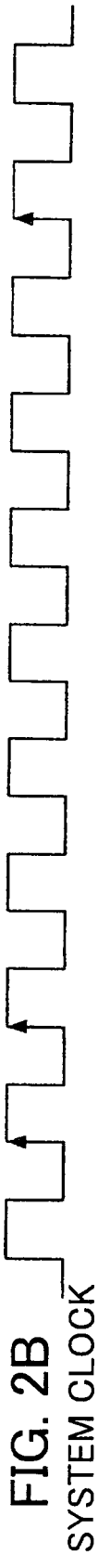
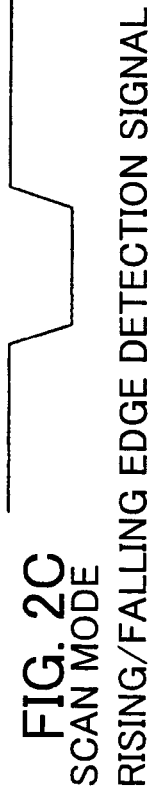
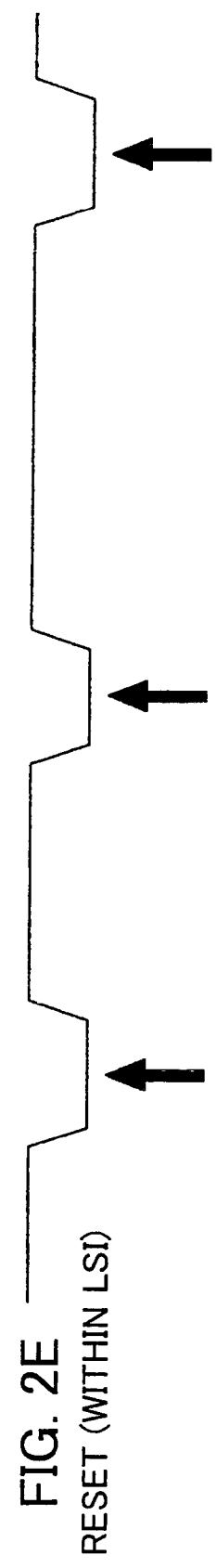
FIG. 2A SCAN MODE
FIG. 2B SYSTEM CLOCK
FIG. 2C SCAN MODE RISING/FALLING EDGE DETECTION SIGNAL
FIG. 2D RESET (EXTERNAL INPUT)
FIG. 2E RESET (WITHIN LSI)
← INTERNAL RESET WITH RISING EDGE OF SCAN MODE SIGNAL
← INTERNAL RESET WITH RESET INPUT
← INTERNAL RESET WITH FALLING EDGE OF SCAN MODE SIGNAL

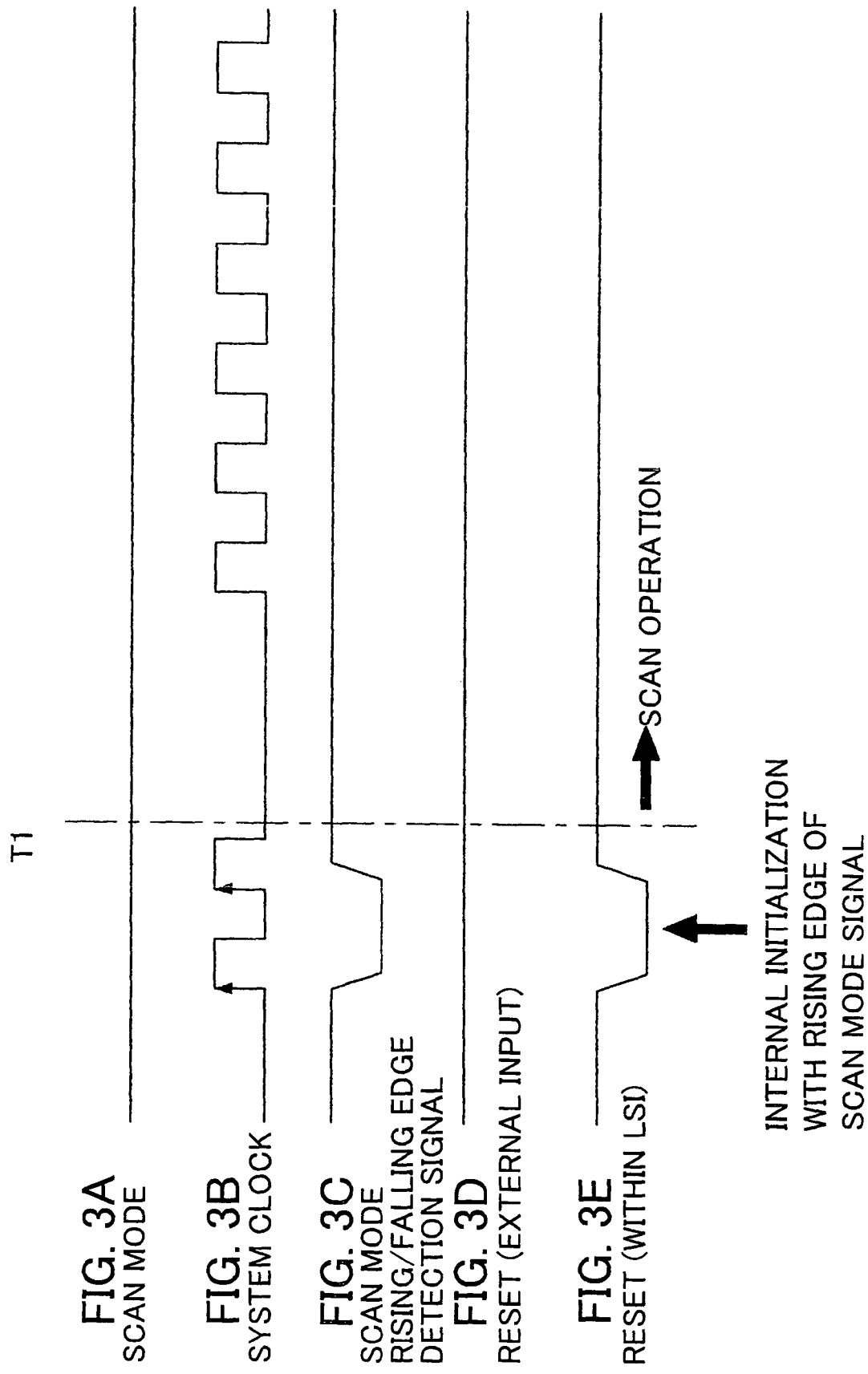

SEMICONDUCTOR INTEGRATED CIRCUIT AND METHOD FOR TESTING SAME

CROSS REFERENCE TO RELATED APPLICATIONS

The present document claims priority to Japanese Priority Document JP2002-277285, filed in the Japanese Patent Office on Sep. 24, 2002, the entire contents of which are incorporated herein by reference to the extent permitted by law.

BACKGROUND OF THE INVENTION

1. Field of the Invention

The present invention relates to a semiconductor integrated circuit, such as an LSI, and particularly to a semiconductor integrated circuit in which a scan circuit is provided, and to a method of testing the same.

2. Description of the Related Art

Scan testing has conventionally been known as a method of testing LSIs.

FIG. 4 shows a model of a semiconductor integrated circuit (LSI) on which scan testing can be performed. Various logical circuits are constructed as internal circuitry 60 in this LSI, and input data from, for example, input terminals in 1 through in 4 are computed by the internal circuitry 60. Then, the computed result is outputted from output terminals out 1 through out 4.

In such an LSI, in order to make scan testing possible, scan flip-flops (hereinafter referred to as FFs) 61 through 68 are provided as shown in the figure. These scan FFs 61 through 68 are, for example, flip-flops having the functions of a multiplexer, and a given required number of scan flip-flops are serially connected between a scan input terminal (scan in) and a scan output terminal (scan out). This serial connection is called a scan chain.

By inputting a scan data pattern from the scan input terminal (scan in), the scan flip-flops 61 through 64 are set to arbitrary values as input for the internal circuitry 60. The values that are set are processed by the internal circuitry 60, and result data thereof are outputted to the scan flip-flops 65 through 68. Then, data on the scan chain are shifted, and the result data outputted from the scan output terminal (scan out) are checked. Through such a method, LSIs are tested for defects.

FIG. 4 shows an extremely simplified model of scan testing. Various scan testing methods are described in, for example, the documents below.

[Patent Document 1] Japanese Patent Application Publication Sho-63-134970

[Patent Document 2] Japanese Patent Application Publication Hei-4-72583

[Patent Document 3] Japanese Patent Application Publication Hei-5-172897

[Patent Document 4] Japanese Patent Application Publication Hei-4-287510

SUMMARY OF THE INVENTION

However, with a LSI in which a scan circuit, such as the scan chain mentioned above, is inserted, because the value of a register within a LSI under operation can be outputted externally, and data can be inputted to a register from outside, the following inconveniences may arise.

For example, considering an LSI that handles security data such as encryption codes, when a scan operation is performed while data are being transmitted/received and loaded to a register, there is a possibility that the security data may be outputted externally via the scan chain. In other words, by using the scan chain configuration, there is some risk of having security data extracted.

Similarly, by performing a scan operation while security data related to reception or the like are being written in an internal RAM, there is a possibility that that security data may be outputted externally via the scan chain.

Further, under normal mode, there is a risk of having data extracted by controlling the shift enable signal by some method and performing a scan chain shift operation.

In addition, because it is possible to input data using the scan chain, one cannot say for sure that unauthorized operation of the LSI would not occur by writing data in an internal register or RAM via the scan chain, thereby altering data such as encryption codes, which is called "spoofing."

In other words, especially with respect to LSIs that handle security data such as encryption codes, providing a scan chain and making scan tests possible entails the risk of unauthorized access to security data, having encryption codes cracked, or occurrences of spoofing through data tampering.

On the other hand, unless scan testing is performed, high quality LSI testing becomes difficult and becomes a problem in manufacturing.

In view of such problems, the present invention seeks to provide a semiconductor integrated circuit which makes scan testing possible while preventing unauthorized access to or alteration of security data stored internally in the LSI.

In other words, a semiconductor integrated circuit according to an embodiment of the present invention is a semiconductor integrated circuit having a normal operation mode and a test mode for scan testing internal logical circuitry. The semiconductor integrated circuit includes: a plurality of flip-flops arranged so as to perform scan testing on the internal logical circuitry mentioned above; and reset means for resetting the plurality of flip-flops mentioned above when transitioning from the normal mode mentioned above to the test mode mentioned above in accordance with a mode signal for selectively specifying the normal operation mode or the test mode by its logical level.

The reset means mentioned above also resets the plurality of flip-flops mentioned above when transitioning from the test mode to the normal operation mode in accordance with the mode signal mentioned above.

The semiconductor integrated circuit may further include output control means that is connected serially to the plurality of flip-flops mentioned above and which outputs data that is supplied during the test mode and prohibits the outputting of data that is supplied during the normal operation mode.

The semiconductor integrated circuit may further include memory means connected to the plurality of flip-flops mentioned above and access control means for prohibiting access to the memory means mentioned above during the test mode in accordance with the mode signal mentioned above.

The semiconductor integrated circuit may further include transition detection means for detecting the transition timing of the logical level of the mode signal mentioned above, and the reset means mentioned above resets the plurality of flip-flops when the transition detection means detects the transition timing.

A semiconductor integrated circuit according to an embodiment of the present invention is a semiconductor integrated circuit having a test mode for scan testing an internal logical circuitry and a normal operation mode, and it includes: a plurality of flip-flops arranged so as to perform scan testing on the internal logical circuitry mentioned above;

and reset means for resetting the plurality of flip-flops mentioned above when transitioning from the test mode to the normal operation mode in accordance with a mode signal for selectively specifying the normal operation mode or the test mode by its logical level.

The semiconductor integrated circuit further includes transition detection means for detecting the transition timing of the logical level mentioned above of the mode signal, and the reset means mentioned above resets the plurality of flip-flops when the transition detection means detects the transition timing.

A semiconductor integrated circuit according to an embodiment of the present invention is a semiconductor integrated circuit having a test mode for scan testing internal logical circuitry and a normal operation mode, and it includes: a plurality of flip-flops arranged so as to perform scan testing on the internal logical circuitry mentioned above; and output control means, which is connected serially to the plurality of flip-flops mentioned above, for outputting data that is supplied during the test mode and prohibiting the outputting of data that is supplied during the normal operation mode.

A semiconductor integrated circuit according to an embodiment of the present invention is a semiconductor integrated circuit having a test mode for scan testing internal logical circuitry and a normal operation mode, and it includes: a plurality of flip-flops arranged so as to perform scan testing on the internal logical circuitry mentioned above; memory means connected to the plurality of flip-flops mentioned above; and access control means for prohibiting, in accordance with a mode signal for selectively specifying the normal operation mode or the test mode by its logical level, access to the memory means mentioned above during the test mode.

A testing method according to an embodiment of the present invention is a testing method for an integrated circuit having a test mode for scan testing and a normal mode, and which includes internal logical circuitry and a plurality of flip-flops for scan testing the internal logical circuitry. The testing method resets the plurality of flip-flops mentioned above upon transition from the normal operation mode to the test mode.

The testing method also resets the plurality of flip-flops upon transition from the test mode to the normal operation mode.

A testing method according to an embodiment of the present invention is a testing method for an integrated circuit including an internal logical circuitry, a plurality of flip-flops for scan testing the internal logical circuitry mentioned above, and memory means connected to the plurality of flip-flops mentioned above and which has a test mode for performing the scan test mentioned above, and a normal operation mode. During the test mode, access to the memory means mentioned above is prohibited.

According to the embodiments of the present invention above, flip-flops constituting a scan chain are reset when scan testing is initiated or terminated by a mode signal for switching between a normal operation state and a scan operation state. In other words, scan operations are initiated or terminated in a state where no data are left behind in the flip-flops.

In addition, it is made impossible to access the internal memory means utilizing scan test operations during scan testing.

Further, according to the embodiments of the present invention above, the output control means connected serially to the plurality of flip-flops operates to output data only during scan testing, and it is unable to output, or, for example, shift out, data by the scan chain during normal operation.

As can be understood from the description above, the following advantages may be obtained from embodiments of the present invention.

The flip-flops constituting the scan chain are reset when scan testing is initiated in accordance with the mode signal for selectively specifying the normal operation mode or the test mode. Therefore, because scan operations are initiated under a condition in which the data that was held by the flip-flops during the normal operation mode are not left behind, it becomes impossible to extract data using scan test operations during the normal operation mode.

Further, because the flip-flops constituting the scan chain are reset when scan testing is terminated, transitioning to the normal operation mode in a state in which the data that was loaded to the flip-flops during scan test operations are left behind is prevented. Therefore, loading the data using scan test operations and then performing normal operations can be prevented.

In addition, the internal memory means cannot be accessed using scan test operations during scan testing. For this reason, accessing memory means, such as a RAM and the like, using scan test operations during scan testing, thereby reading data in the memory means via the scan chain, or writing arbitrary values to the memory means and transitioning to normal operations is made impossible. Thus, the extraction of security data, such as encryption codes and the like, or spoofing by way of tampering with data is prevented.

Further, by providing the output control means, which is connected serially to the scan chain, for outputting data that are supplied during the test mode and prohibiting the outputting of data that are supplied during the normal operation mode, shifting out by the scan chain during the normal operation mode is made impossible. For this reason, the reading of the values of the internal flip-flops by a shift out using the scan chain by altering only the scan enable signal during normal operation mode can be prevented.

Thus, the leakage of values of the internal register of the LSI (semiconductor integrated circuit) using the scan chain or scan test operations can be prevented, and, also, performing normal operations after setting values in the LSI internal register or memory using scan test operations can be prevented. Therefore, even LSIs that handle security data, such as encryption keys and the like, may have their circuits configured so as to be scan testable without giving rise to security issues. In other words, a semiconductor integrated circuit (LSI) that is suitable for manufacture and that can be scan tested without lowering its level of security may be realized.

BRIEF DESCRIPTION OF THE DRAWINGS

FIG. 2 is a wave form chart illustrating the resetting operation of a scan chain on an embodiment of the present invention;

FIG. 3 is a wave form chart illustrating the motion for the creation of a scan pattern on an embodiment of the present invention.

DESCRIPTION OF THE PREFERRED EMBODIMENTS

An LSI 1 as an embodiment of a semiconductor integrated circuit of the present invention and which executes the testing method of the present invention will be described below.

Figure 1:
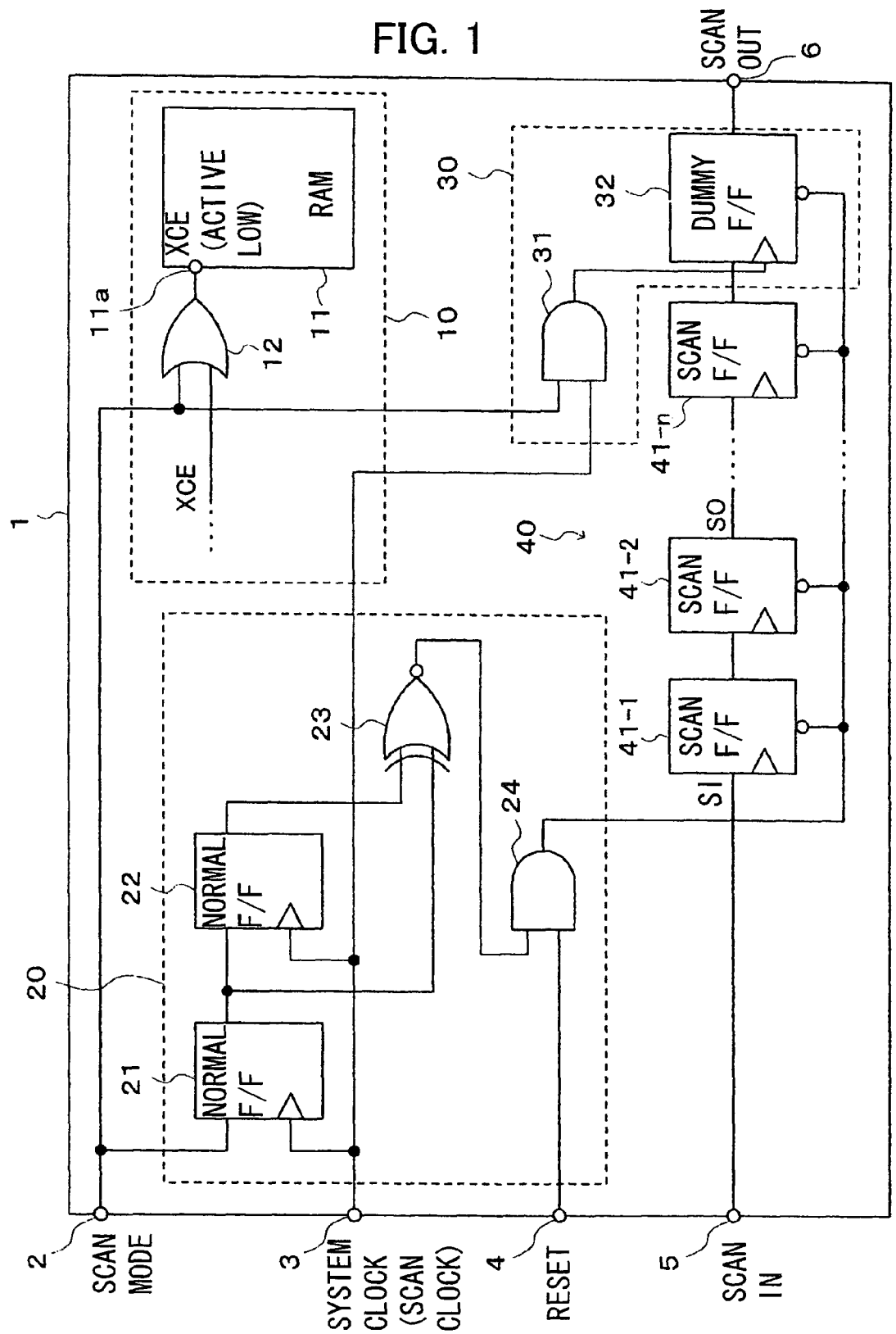
FIG. 1 is a circuit diagram of a main portion of a LSI according to an embodiment of the present invention.

The configuration of a main portion of the LSI 1 is shown in FIG. 1. It is to be noted that in FIG. 1, the circuit system corresponding to the internal circuitry 60 described with reference to FIG. 4, in other words, the main logical circuit system of the LSI 1, is not shown, and only portions that directly concern the present invention are shown.

In the LSI 1, there are provided a scan in terminal 5 and a scan out terminal 6. A scan chain including scan flip-flops 41-1 through 41-n and a dummy flip-flop 32 is formed between the scan in terminal 5 and the scan out terminal 6.

Figure 4:
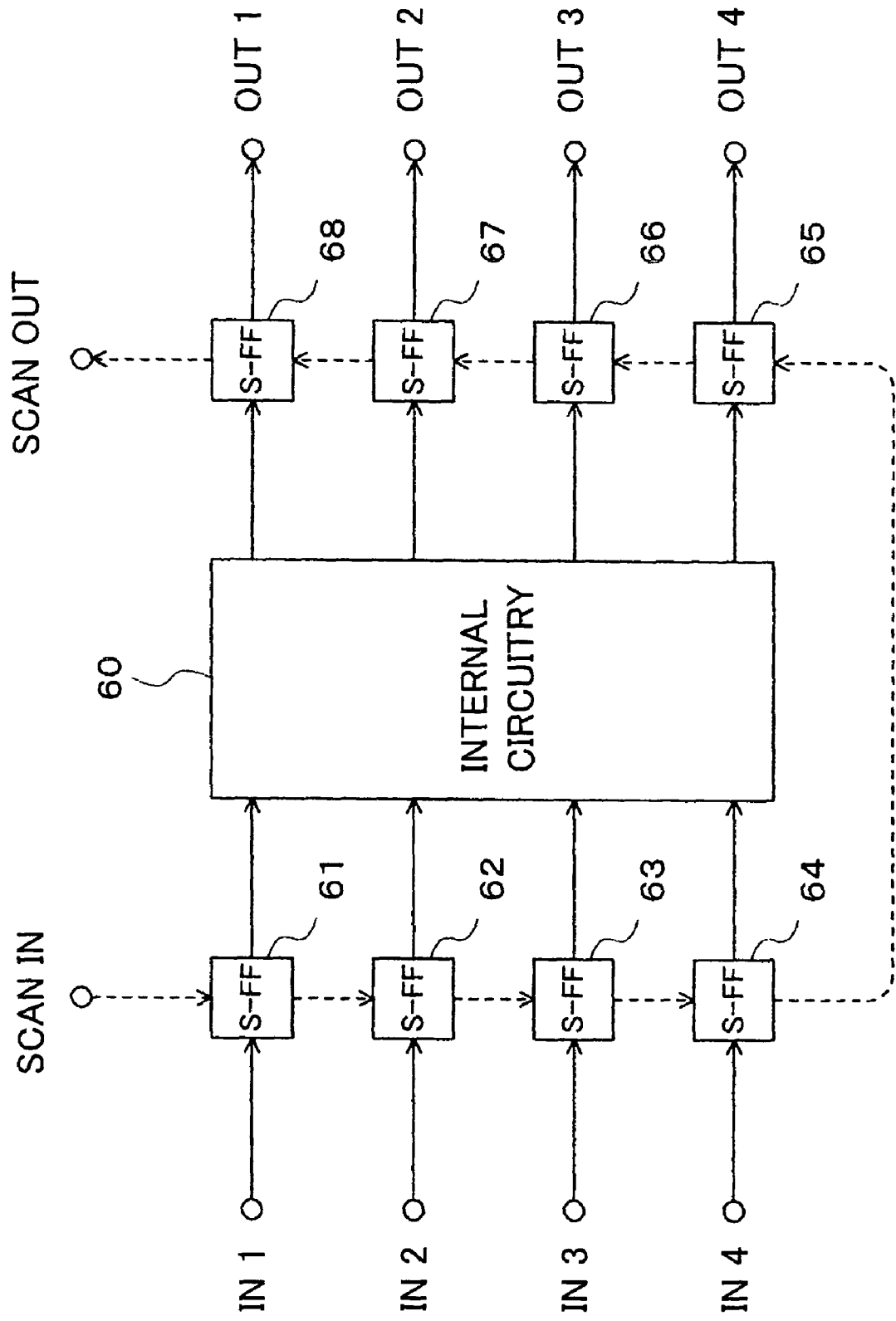
FIG. 4 is an illustrative diagram of the scan operation.

Each of the scan flip-flops 41-1 through 41-n is a flip-flop having the functions of a multiplexer, and, as in the scan flip-flops 61 through 68 for the internal circuitry 60 shown in FIG. 4, is connected to internal circuitry that is now shown, and is configured so as to make scan testing possible. Thus, in FIG. 1, only the scan shift path shown with the broken line in FIG. 4 is shown.

During scan testing, a scan pattern is inputted to the scan flip-flops 41-1 through 41-n from the scan in terminal 5. By a shift out of the scan chain, data that is to be checked for scan testing are shifted out from the scan out terminal 6.

Flip-flops with asynchronous reset are used for the scan flip-flops 41-1 through 41-n and the dummy flip-flop 32.

A scan mode signal is inputted to a scan mode input terminal 2. The scan mode signal is a signal for switching the LSI 1 between a normal operation state and a scan operation state. In the present example, when the scan mode signal is "L," the LSI 1 enters the normal operation state, and when the scan mode signal is "H," the LSI 1 enters the scan operation state.

A system clock of the LSI 1 is inputted to a clock input terminal 3. In the present example, the system clock also is used as a scan clock during a scan operation. In other words, the system clock from the clock input terminal 3 is used directly as an operation clock for the scan flip-flops 41-1 through 41-n.

A reset signal for internally resetting the LSI 1 is inputted from a reset input terminal 4. The internal circuitry not shown in the figure is reset in accordance with the reset signal supplied from outside.

The LSI 1 shown in FIG. 1, due to its configuration, has the following three characteristics:

(1) Reset control for the flip-flops of the scan chain.

(2) Access prohibition control for the internal memory means (RAM 1) during scan operation; and (3) Output control by the dummy flip-flop 32.

These points will be described below.

<(1) Reset Control for the Flip-Flops of the Scan Chain>

As shown in the figure, flip-flops 21 and 22, an EX-OR gate 23 and an AND gate 24 are provided as a reset control block 20.

The flip-flops 21 and 22 and the EX-OR gate 23 are provided to detect the transition timing of the logical level of the scan mode signal.

The flip-flops 21 and 22 operate on the system clock from the input terminal 3. The flip-flop 21 of the first stage latches the scan mode signal, and the flip-flop 22 in the subsequent stage latches the latched output of the flip-flop 21.

At the EX-OR gate 23, the XOR (inverted output) of the latched output of each of the flip-flops 21 and 22 is obtained and supplied to the AND gate 24. Another terminal of the AND gate 24 is connected to the reset input terminal 4, and an external reset signal is supplied to the AND gate 24.

The AND output of the AND gate 24 is taken to be a reset signal for the scan flip-flops 41-1 through 41-n and the dummy flip-flop 32.

The operation of the reset control block 20 is described with reference to FIG. 2.

FIG. 2A shows the scan mode signal. The LSI enters the scan operation mode when the scan mode signal is "H."

In the reset control block 20, because the flip-flops 21 and 22, as described above, operate on the system clock shown in FIG. 2B, latch the scan mode signal, and output via the EX-OR gate 23, an edge detection signal shown in FIG. 2C is obtained in correspondence with the rising edge and the falling edge of the scan mode signal.

In addition, by adopting a configuration in which the latched output of the two-staged flip-flops 21 and 22 is outputted via the EX-OR gate 23, the outputted edge detection signal (L level) is made to have a pulse length that is at least equal to or greater than one clock period of the system clock.

Because the edge detection signal is supplied to the scan flip-flops 41-1 through 41-n and the dummy flip-flop 32 via the AND gate 24, the scan flip-flops 41-1 through 41-n and the dummy flip-flop 32 are reset in accordance with the rising and the falling of the scan mode signal as shown in FIG. 2E by the edge detection signal of an L level.

In addition, when a reset signal (L level), as shown in FIG. 2D, is inputted from the reset input terminal 4, because this reset signal is supplied to the scan flip-flops 41-1 through 41-n and the dummy flip-flop 32 via the AND gate 24, these flip-flops are reset as shown in FIG. 2E with external reset inputs as well.

Thus, the scan flip-flops 41-1 through 41-n and the dummy flip-flop 32 are reset in accordance with the edge timing of the scan mode signal, in other words, upon transition from the normal operation state to the scan operation state, as well as from the scan operation state to the normal operation state.

Therefore, it is made impossible to perform scan operations without resetting at the time of initiating scan operations, or to make the LSI 1 perform normal operations without being reset upon termination of scan operations.

In the LSI 1 of the present invention in which the scan circuit is inserted, by shifting out the data of the scan flip-flops 41-1 through 41-n using the scan chain when entering a scan operation from a normal operation, there is the risk that the status of the scan flip-flops 41-1 through 41-n during a normal operation just before entering a scan operation gets externally outputted. This means that there is a possibility that security data, such as encryption keys and the like, may be leaked.

As such, in the present example, by initializing the internals of the LSI by resetting upon entering the scan mode based on the rising edge of the scan mode signal as described above, it can be made impossible to shift out the data held during normal operations.

In addition, by inserting the scan circuit, it becomes possible to load data to the scan flip-flops 41-1 through 41-n via the scan chain from outside during scan operations. If a transition is then made to normal operations, it is possible to make the LSI 1 perform normal operations using the loaded data. As a result, there is a possibility that security data, such as encryption codes and the like, becomes altered and used.

As such, in the present example, this is prevented by resetting upon termination of the scan mode as well and initializing the internals of the LSI 1 based on the falling edge of the scan mode signal as described above.

The edge detection signal, which serves as the reset signal, is made to have a pulse length that is, as described above, at least equal to or greater than one clock period of the system clock. Thus, it is ensured that the scan flip-flops 41-1 through 41-n are reset reliably.

In the present example, the system clock is used directly as the scan clock, and the system clock also is used for edge detection in the reset control block 20. The reasons for this are described below.

For example, if the scan clock and the system clock are made distinct, and a rising/falling edge detection circuit (flip-flops 21 and 22 and the EX-OR gate 23) for the scan mode signal is configured using a clock that is not used during scan operations (the system clock, for example), once the transition is made from normal operations to scan operations, scan operations can be performed without inputting a clock to the edge detection circuit. For this reason, no resetting is performed at the time of initiating scan operations, and this gives rise to the risk of making it possible to externally output the values of the internal registers.

On the other hand, if the rising/falling edge detection circuit for the scan mode signal is configured using a clock that is not used during normal operations (the scan clock, for example), when scan operations are terminated, a normal operation can be performed without inputting a clock to the edge detection circuit. As a result, the LSI may be operated with arbitrary values set in the register from outside.

In the present example, in order to prevent such problems, the same clock is used during both system operations and scan operations, and that clock (the system clock) is inputted to the rising/falling edge detection circuit for the mode signal.

In the present example, when creating scan patterns, two clocks of the system clock may be inputted once the scan mode is entered. Wave forms similar to those of FIG. 2A through FIG. 2E are shown in FIG. 3A through FIG. 3E. However, since the resetting is undone when two clocks of the system clock are inputted, scan operations can be performed thereafter, that is, after T1.

Thus, two clocks are initially inputted in the present method of creating a scan pattern.

<(2) Access Prohibition Control for Internal Memory Means During Scan Operations>

Next, the access prohibition control for the internal memory means during scan operations will be described.

As the RAM control block 10 shown in FIG. 1, a RAM 11 and an OR gate 12 are provided. It is assumed that RAM 11 is, for example, a memory section where security data is stored. The RAM 11 is controlled so as to be accessible or inaccessible by a chip enable signal XCE inputted to a chip enable terminal 11a. In this case, the chip enable signal XCE is active at the low level.

During normal operations, the chip enable signal XCE generated by the internal circuitry of the LSI 1 is supplied to the chip enable terminal 11a via the OR gate 12, and access control of the RAM 11 is performed.

Further, in the present example, the scan mode signal is supplied to the chip enable terminal 11a via the OR gate 12.

As described above, by an "H" scan mode signal, the LSI 1 is placed in scan mode. Since the chip enable terminal 11a has an active low configuration, during scan operation periods, access prohibition control for the RAM 11 is maintained.

As in the present example, in an LSI in which a scan circuit is inserted, during scan operations, there is a possibility that data in an internal RAM may be read via a scan chain by accessing the internal RAM utilizing scan operations or that normal operations are performed after writing arbitrary values in the internal RAM. Thus, in the present example, by using the scan mode signal as the chip enable signal, the RAM 11 is made inaccessible during scan operations.

Although in FIG. 1, the RAM 11 was used as an example, a ROM internal to the LSI, a flash memory and the like may be made inaccessible during scan operations by a similar method, thereby protecting stored security data and the like.

<(3) Output Control by Dummy Flip-Flop>

Next, output control by the dummy flip-flop 32 will be described.

A dummy flip-flop control block 30 shown in FIG. 1 is provided as an output control means for the scan chain configured with the scan flip-flops 41-1 through 41-n.

As shown in FIG. 1, an AND gate 31 is provided as the dummy flip-flop control block 30, and the output of the AND gate 31 is taken to be the clock of the dummy flip-flop 32.

The AND gate 31 performs a logical AND operation on the system clock and the scan mode signal.

Because the LSI 1 enters scan mode when the scan mode signal is "H," the AND gate 31 supplies the system clock to the dummy flip-flop 32 only during scan operation periods.

In other words, the clock is not supplied to the dummy flip-flop 32 during a normal operation state and, thus, does not operate.

The dummy flip-flop 32 is connected to the final stage of the scan chain. Therefore, the fact that the dummy flip-flop 32 does not operate during normal operations means that shifting out using the scan chain cannot be done during normal operations.

The resetting by the detected edges of the scan mode signal mentioned above is not a security measure for shifting out during normal operations.

In addition, by being scan shifted by switching only the scan enable signal during normal operations, there is a possibility that the values of the internal scan flip-flops 41-1 through 41-n can be read using the scan chain.

In order to prevent such unauthorized reading of data during normal operations, in the present example, shifting out is made impossible during normal operations by connecting a dummy flip-flop 32, which operates only during scan operations, to the final stage of the scan chain.

Although in the present invention, the configuration is such that one dummy flip-flop 32 is connected to the final stage of the scan chain, other connective positions and numbers for the dummy flip-flop 32 are conceivable.

In other words, for example, the dummy flip-flop 32 may be located in a stage subsequent to a flip-flop that handles security data to protect only the security data.

In addition, the output control means may be configured by arranging an AND gate(s), instead of the dummy flip-flop 32, in an appropriate manner, and similar advantages can still be obtained by preventing data from being outputted to the scan out terminal 6 during normal operations.

Thus, three characteristic configurations of the present embodiment have been described. With such configurations, the LSI 1 is provided with a scan chain, thus making scan operations possible, while also preventing data leakage due to the scan chain or unauthorized rewriting of data from outside. Therefore, the LSI can be tested using scan methods without lowering its security level, and a LSI that is suitable for use in handling security data can be provided.

In FIG. 1, a configuration in which the three functions of (1) reset control of the scan chain, (2) access prohibition control for the internal memory means during scan operations, and (3) output control by the dummy flip-flop are realized is shown. However, by simply providing at least one of these functions, an LSI equipped with a scan circuit and which has high security functions can be provided. Which of the three functions should be provided may be decided depending on the intended application of the LSI being designed, its circuit configuration or scale, data to be handled, the demanded level of security and the like.

Further, it should be obvious that for the reset control block 20, the RAM control block 10 and the dummy flip-flop control block 30, various configurations, such as the kind or number of registers and gates to use, for example, are conceivable.

Since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims rather than by the foregoing description, and all changes which come within the meaning and range of equivalents of the claims are intended to be embraced therein.

What is claimed is:

1. A semiconductor integrated circuit having a normal operation mode and a test mode for scan testing internal logical circuitry, comprising:
    a scan in terminal providing an inputted scan pattern to a scan chain between said scan in terminal and a scan out terminal;
    a plurality of flip-flops arranged in said scan chain so as to perform scan testing for said internal logical circuitry responsive to said scan pattern; and
    a reset means for resetting said plurality of flip-flops at a transition time, between said test mode and said normal mode, responsive to a scan mode signal for selectively specifying one of said normal operation mode and said test mode by the logical level of said mode signal,
    whereby said resetting is always performed at said transition time.

2. The semiconductor integrated circuit according to claim 1, further comprising output control means that is connected serially to said plurality of flip-flops, and which outputs data that is supplied during said test mode while prohibiting the outputting of data that is supplied during said normal operation mode.

3. The semiconductor integrated circuit according to claim 2, further comprising:
    memory means connected to said plurality of flip-flops; and
    access control means for prohibiting access to said memory means during said test mode responsive to said mode signal.

4. A semiconductor integrated circuit having a normal operation mode and a test mode for scan testing internal logical circuitry as set forth in claim 1, wherein said plurality of flip-flops are serially arranged so as to perform scan testing for said internal logical circuitry.

5. The semiconductor integrated circuit according to claim 4, further comprising transition detection means for detecting the transition time of said logical level of said mode signal, wherein said reset means resets said plurality of flip-flops when said transition time detection means detects said transition time.

6. The semiconductor integrated circuit according to claim 1, further comprising transition detection means for detecting the transition time of said logical level of said mode signal, wherein said reset means resets said plurality of flip-flops when said transition time detection means detects said transition time.

7. A method of testing a semiconductor integrated circuit as defined in claim 6, wherein
    said plurality of flip-flops are reset at said transition time, between said test mode and said normal mode.

8. A semiconductor integrated circuit having a normal operation mode and a test mode for scan testing internal logical circuitry as set forth in claim 1, wherein said reset control means obtains an edge detection signal corresponding with the rising edge and the falling edge of the scan mode signal.

9. A method of testing a semiconductor integrated circuit as defined in claim 1, wherein
    said plurality of flip-flops are reset at said transition time, between said test mode and said normal mode.

10. The semiconductor integrated circuit as set forth in claim 1 further including a dummy flip-flop in said scan chain that is responsive to a rising and falling of the scan mode signal for resetting said plurality of flip-flops.

11. A semiconductor integrated circuit having a normal operation mode and a test mode for scan testing internal logical circuitry, comprising:
    an inputted scan pattern to a scan chain between said scan in terminal and a scan out terminal;
    a plurality of flip-flops arranged in said scan chain so as to perform scan testing for said internal logical circuitry responsive to said scan pattern;
    a scan mode input providing a scan mode signal for switching said internal logic circuitry between said normal operation state and a scan operation state including said test mode; and
    a reset means for resetting said plurality of flip-flops at a transition time, between said test mode and said normal mode, responsive to said scan mode signal for selectively specifying one of said normal operation mode and said test mode by the logical level of said mode signal,
    wherein said reset means is responsive to a reset signal inputted from a reset input terminal and resets said plurality of flip-flops at said transition time, between said test mode and said normal mode, in accordance with said mode signal, and further comprising
    output control means that is connected serially to said plurality of flip-flops, and which outputs data that is supplied during said test mode while prohibiting the outputting of data that is supplied during said normal operation mode, and
    memory means connected to said plurality of flip-flops; and
    access control means for prohibiting access to said memory means during said test mode responsive to said mode signal,
    whereby said resetting is always performed at said transition time.

12. A semiconductor integrated circuit having a normal operation mode and a test mode for scan testing internal logical circuitry as set forth in claim 11, wherein said plurality of flip-flops are arranged so as to perform scan testing for said internal logical circuitry.

13. The semiconductor integrated circuit according to claim 12, further comprising transition detection means for detecting the transition time of said logical level of said mode signal, wherein said reset means resets said plurality of flip-flops when said transition time detection means detects said transition time.

14. The semiconductor integrated circuit according to claim 11, further comprising transition detection means for detecting the transition time of said logical level of said mode signal, wherein said reset means resets said plurality of flip-flops when said transition time detection means detects said transition time.

15. A semiconductor integrated circuit having a normal operation mode and a test mode for scan testing internal logical circuitry as set forth in claim 11, wherein said reset control means obtains an edge detection signal corresponding with the rising edge and the falling edge of the scan mode signal.

16. A semiconductor integrated circuit having a normal operation mode and a test mode for scan testing internal logical circuitry, comprising:
- a scan path between a scan in source receiving a scan pattern and a scan output with a scan chain including a plurality of scan flip-flops formed between said scan in source and the scan output, said scan flip-flops configured to make scan testing possible according to said scan pattern;
- a scan mode signal provided for switching said internal logic circuitry between said normal operation mode and said test mode responsive to said scan mode signal;
- a reset input signal for controlling reset of said flip-flops by a reset control block provided to detect a transition time of a logical level of the scan mode signal by an edge detection signal having a pulse length that is at least equal to or greater than one clock period of a system clock, wherein
- scan operations are inhibited without resetting at the time of initiating scan operations or normal operations without being reset upon termination of scan operations,
- whereby said resetting is always performed at said transition time.

17. The semiconductor circuit as set forth in claim 16, further including a dummy flip-flop in said scan path.

18. The semiconductor circuit as set forth in claim 16, wherein, during scan testing, said scan pattern is inputted to the scan flip-flops so that by a shift out of said scan chain, data that is to be checked for scan testing are shifted out from the scan output.

19. The semiconductor circuit as set forth in claim 16, wherein said reset control block includes a pair of flip-flops and logical output circuits arranged to detect the transition time of a logical level of the scan mode signal.

* * * * *